(12) United States Patent
Knoedgen et al.

(10) Patent No.: US 9,635,719 B2
(45) Date of Patent: Apr. 25, 2017

(54) HIGH VOLTAGE CONVERTER WITHOUT AUXILIARY WINDING

(71) Applicants: Dialog Semiconductor GmbH, Kirchheim/Teck-Nabern (DE); Dialog Semiconductor Inc., Campbell, CA (US)

(72) Inventors: Horst Knoedgen, Munich (DE); Xiaoyan Wang, Milpitas, CA (US); Chuanyang Wang, San Jose, CA (US)

(73) Assignees: Dialog Semiconductor (UK) Limited, London (GB); Dialog Semiconductor Inc., Campbell, CA (US)

( * ) Notice: Subject to any disclaimer, the term of this patent is extended or adjusted under 35 U.S.C. 154(b) by 0 days.

(21) Appl. No.: 14/613,628

(22) Filed: Feb. 4, 2015

(65) Prior Publication Data

US 2015/0237693 A1    Aug. 20, 2015

(30) Foreign Application Priority Data

Feb. 20, 2014 (EP) .................................... 14156019

(51) Int. Cl.
H05B 33/08 (2006.01)

(52) U.S. Cl.
CPC ..... *H05B 33/0815* (2013.01); *H05B 33/0812* (2013.01); *H05B 33/0845* (2013.01); *H05B 33/0887* (2013.01); *H05B 33/0851* (2013.01)

(58) Field of Classification Search
CPC ........ H02M 1/08; H02M 3/156; H02M 3/158; H02M 3/1582; H02M 7/06;

(Continued)

(56) References Cited

U.S. PATENT DOCUMENTS

| 6,285,622 B1 | 9/2001 | Haraguchi et al. |
| 7,550,934 B1 * | 6/2009 | Deng ................. H05B 33/0887 |
| | | 315/209 R |

(Continued)

FOREIGN PATENT DOCUMENTS

| EP | 2 326 148 | 5/2011 |
| EP | 14156019.3-1802 | 7/2014 |

OTHER PUBLICATIONS

Chinese Office Action, Application No. 201510011383.7, Applicant: Dialog Semiconductor GmbH, Mail date: Dec. 8, 2016, 11 pgs, and English language translation, 11 pgs.

*Primary Examiner* — Thai Pham
*Assistant Examiner* — Borna Alaeddini
(74) *Attorney, Agent, or Firm* — Saile Ackerman LLC; Stephen B. Ackerman

(57) ABSTRACT

The present document relates to driver circuits and/or power converters, e.g. for Solid State Lighting (SSL) devices, such as Light Emitting Diodes (LEDs). A controller for a driver circuit which is configured to provide a drive voltage to a load subject to an input voltage is described. The driver circuit comprises a power converter network and a power transistor. The controller comprises a control transistor which is configured to couple or to decouple a low voltage terminal of the power transistor to or from a low voltage potential, to put the power transistor to a conduction-state or an off-state, respectively. Furthermore, the controller comprises a charging transistor, arranged in parallel to the control transistor, and configured to couple or to decouple the low voltage terminal of the power transistor to a supply voltage capacitor, to put the power transistor to the conduction-state or off-state, respectively.

18 Claims, 8 Drawing Sheets

(58) Field of Classification Search
CPC ... H02M 2001/0006; H02M 2001/007; H02M 2001/0022; H02M 1/36; H05B 33/0815; H05B 33/0851; H05B 33/0887
See application file for complete search history.

(56) References Cited

U.S. PATENT DOCUMENTS

| | | | |
|---|---|---|---|
| 9,203,307 B2* | 12/2015 | Walters | H02M 3/158 |
| 2009/0295228 A1* | 12/2009 | Ochi | H02M 3/156 |
| | | | 307/66 |
| 2010/0039083 A1* | 2/2010 | Moriarty, Jr. | H02M 5/293 |
| | | | 323/282 |
| 2012/0274228 A1* | 11/2012 | Szczeszynski | H05B 33/0851 |
| | | | 315/224 |
| 2013/0181632 A1 | 7/2013 | Chu | |
| 2013/0193877 A1 | 8/2013 | Kuo et al. | |

* cited by examiner

HIGH VOLTAGE CONVERTER WITHOUT AUXILIARY WINDING

TECHNICAL FIELD

The present document relates to driver circuits and/or power converters, e.g. for Solid State Lighting (SSL) devices, such as Light Emitting Diodes (LEDs).

BACKGROUND

In a LED driver circuit, comprising a fly-back switching circuit or a fly back power converter, a transformer is typically used to transfer electrical energy from an input of the driver circuit to the LEDs via a secondary winding of the transformer. In addition a tertiary or auxiliary winding may be used to supply power to a controller (e.g. an integrated circuit) of the driver circuit, and/or for providing information regarding various voltages and transient signals of the switching waveforms within the power converter.

The use of such an auxiliary winding is disadvantageous as the auxiliary winding adds additional cost to the driver circuit and/or power converter. On the other hand, by removing the auxiliary winding, features such as the provision of a logic supply voltage for the controller of the driver circuit, the detection of freewheeling of the transformer and/or the measurement of various voltages may not be provided anymore.

The present document addresses the above mentioned technical problem. In particular, the present document describes a driver circuit and/or a power converter which is configured to provide any one or more of the above mentioned features without the need for an additional auxiliary winding. As a result of this, a cost efficient driver circuit and/or power converter, notably for SSL applications, is provided.

A further requirement regarding driver circuits and/or power converters for SSL devices is the compatibility with respect to dimmers, notably with respect to phase-cut dimmers. The driver circuits and/or power converters described in the present document may be configured and/or may be operated to be compatible with such dimmers. As such, cost efficient and dimmer compatible driver circuits for SSL devices may be provided.

SUMMARY

According to an aspect, a controller for a driver circuit which is configured to provide a drive voltage to a load (e.g. to a SSL device) subject to an input voltage (e.g. a mains voltage) is described. The driver circuit comprises a power converter network and a power transistor. The power converter network may comprise an inductor (e.g. a transformer). In particular, the power converter network may comprise a fly back converter network or a resonant converter network. The power transistor (which is also referred to in the present document as a power switch) may comprise a metal oxide semiconductor (MOS) transistor, e.g. a field effect transistor (FET), notably an n-type MOS transistor. Alternatively or in addition, the power transistor may comprise a bipolar transistor.

The controller may comprise a control transistor (also referred to herein as a control switch) which is configured to couple or to decouple a low voltage terminal of the power transistor to or from a low voltage potential (e.g. ground), to put the power transistor to a conduction-state or an off-state, respectively. In case of a MOS transistor, the low voltage terminal may comprise a source of the MOS transistor, and in case of a bipolar transistor, the low voltage terminal may comprise an emitter of the bipolar transistor. The power transistor may further comprise a high voltage terminal. In case of a MOS transistor, the high voltage terminal may comprise a drain of the MOS transistor, and in case of a bipolar transistor, the high voltage terminal may comprise a collector of the bipolar transistor. The power transistor may further comprise an intermediate voltage terminal. In case of a MOS transistor, the intermediate voltage terminal may comprise a gate of the MOS transistor, and in case of a bipolar transistor, the intermediate voltage terminal may comprise a base of the bipolar transistor.

The control transistor may be configured to couple the low voltage terminal of the power transistor directly with the low voltage potential (e.g. to ground), without any intermediate components. The intermediate voltage terminal of the power transistor may be maintained at the level of a gate supply voltage. By increasing the gate-source voltage (or the base-emitter voltage) at the power transistor above the threshold voltage of the power transistor, the power transistor may be brought into a conduction-state. On the other hand, by decreasing the gate-source voltage (or the base-emitter voltage) at the power transistor below the threshold voltage, the power transistor may be brought into the off-state (where substantially no drain-source current (or emitter current) is flowing through the power transistor). The conduction-state may comprise an on-state, where the power transistor has a minimal on-resistance. Furthermore, the conduction-state may comprise a state, where the on-resistance is modulated and where the power transistor behaves as a resistor with a variable resistance.

The controller further comprises a charging transistor (also referred to herein as a charging switch), which is arranged in parallel to the control transistor, and which is configured to couple or to decouple the low voltage terminal of the power transistor to a supply voltage capacitor, to put the power transistor to the conduction-state or off-state, respectively. In particular, the low voltage terminal of the power transistor may be coupled to one side of the supply voltage capacitor. The other side of the supply voltage capacitor may be coupled to the low voltage potential (e.g. to ground). As such, the charging transistor may couple the low voltage terminal of the power transistor to the low voltage potential via the supply voltage capacitor. The charging transistor may be part of a current source and/or of a current mirror.

The supply voltage capacitor may be configured to provide a logic supply voltage to the controller and/or to other functions of a driver circuit. As such, by closing the charging transistor, the low voltage terminal of the power transistor may be brought to the level of the logic supply voltage (plus the level of the low voltage potential). This level may be sufficiently low (relative to the gate supply voltage) to provide a gate-source voltage (or a base-emitter voltage) which exceeds the threshold voltage of the power transistor.

The controller may be configured to put the power transistor to the conduction-state, using the charging transistor, within a first time interval. Furthermore, the controller may be configured to put the power transistor to the conduction-state, using the control transistor, within a second time interval. The first and second time intervals may be different from one another. In addition, the time intervals at which the charging transistor is closed and the time intervals at which the control transistor is closed may be mutually exclusive. As such, the states of the power transistor (notably the conduction-state of the power transistor) may be controlled using two (parallel) transistors, the control transistor and the charging transistor. When using the charging transistor, a drain-source current (or an emitter current) flowing through the power transistor may be used to charge/recharge the supply voltage capacitor, thereby maintaining the logic supply voltage. The recharging of the supply voltage capacitor may be achieved without the use of an auxiliary winding which his magnetically coupled with an inductor of the power converter network. Hence, the recharging of the supply voltage capacitor may be achieved in a cost efficient manner.

The controller may be configured to determine a level of the logic supply voltage provided by the supply voltage capacitor. In particular, it may be determined that the level of the logic supply voltage falls below a pre-determined lower threshold voltage. Furthermore, the controller may be configured to control the charging transistor and the control transistor based on the determined level of the logic supply voltage. In particular, the charging transistor and the control transistor may be controlled such that the logic supply voltage remains at or above the pre-determined lower threshold. At the same time, the charging transistor and the control transistor may be controlled such that the power transistor is operated in the desired state, i.e. such that the driver circuit provides a stable drive voltage.

Hence, by providing and by appropriately controlling a charging transistor in addition to a control transistor, the logic supply voltage can be maintained at a stable level, while at the same time operating the power transistor and the power converter. As such, the provision of a charging transistor allows for a cost efficient and controlled recharging of the supply voltage capacitor.

The conduction-state may correspond to or may comprise an on-state of the power transistor. The controller may be configured to operate the power transistor in a switched mode between the on-state and the off-state. The power transistor may be switched in accordance to a commutation cycle rate. The first time interval may precede the second time interval within a first phase of a commutation cycle, when the power transistor is in an on-state. As indicated above, the power converter network typically comprises an inductor. As a result of this, the current through the power transistor typically ramps up (from zero up to a peak current), when the power transistor is in on-state. By selecting a first time interval which precedes the second time interval (e.g. by selecting the first time interval at the very beginning of the first phase of the commutation cycle), the current for (re)charging the supply voltage capacitor is relatively low. As a result of this, the control of the charging of the supply voltage capacitor may be improved (due to the relatively low current through the power switch). This also allows for an improved over-voltage protection of the supply voltage capacitor (caused by a possible over-charging of the supply voltage capacitor).

The controller may be configured to operate the charging transistor in a linear mode in order to control the level of a current through the power transistor. By controlling the charging transistor in a linear mode, the power transistor may be operated in a linear mode. This may be beneficial for generating a bleeder current to discharge one or more capacitances at the input of the driver circuit. In particular, this may be beneficial for operating driver circuits for SSL devices in conjunction with dimmers. In a similar manner to the charging transistor, the control transistor may be operated in a linear mode (within the second time interval).

Furthermore, the controller may be configured to determine a length of the first time interval and/or an operation point (e.g. an on-resistance) of the charging transistor based on a charge to be provided to the supply voltage capacitor and/or based on a level of the voltage drop across the supply voltage capacitor. In particular, a current through the power transistor may be measured. The charging transistor may be operated to maintain the current through the power transistor at a pre-determined level. Alternatively or in addition, the charging transistor may be operated such that the integral of the current through the power transistor within the first time interval corresponds to the charge which is to be provided to the supply voltage capacitor (e.g. in order to increase the logic supply voltage up to a pre-determined high threshold voltage).

As such, the charging transistor may be used to (re)charge the supply voltage capacitor, when the power transistor is operated in the linear mode, in order to generate a bleeder current. Hence, the bleeder current may be used to charge the supply voltage capacitor, thereby providing an energy efficient driver circuit.

As indicated above, the controller may be configured to control an on-resistance of the charging transistor and/or of the control transistor to operate the power transistor in a switched mode and/or in a linear mode. In particular, the combination of the charging transistor and of the control transistor may be controlled as if the power transistor were operated by a single control transistor. However, the provision of the additional charging transistor provides the possibility of charging the supply voltage capacitor in a power efficient and cost efficient manner.

The controller or the driver circuit may further comprise a regulator arranged in parallel to the supply voltage capacitor. The regulator may be configured to limit a voltage drop across the supply voltage capacitor to a pre-determined overvoltage level. As such, the supply voltage capacitor may be protected from over-charging. The regulator may comprise a shunt regulator and/or a regulator which is configured to sink and/or source a current.

The controller may further comprise a charging diode configured to block a current flowing from the supply voltage capacitor to the power transistor. The charging diode may be or may comprise an active diode function (comprising e.g. a MOS transistor or a bipolar junction transistor (BJT)). As such, the charging diode may prevent a discharging of the supply voltage capacitor, e.g. at a time instant when the power transistor is in off-state.

The controller may further comprise freewheeling detection circuitry (comprising e.g. a comparator) configured to detect a transient of a voltage level at the low voltage terminal of the power transistor, when the freewheeling detection circuitry is coupled to the low voltage terminal of the power transistor and when the power transistor is in off-state. Typically, the power transistor comprises a (parasitic) drain-source capacitance (or a collector-emitter capacitance). This drain-source capacitance may couple a transient of the voltage at the high voltage terminal of the power transistor (caused e.g. by a freewheeling of the inductor) to the low voltage terminal of the power transistor. As such, freewheeling may be detected at the low voltage terminal of the power transistor in a cost efficient manner (without the need of a dedicated auxiliary winding which is magnetically coupled to the inductor of the power converter network).

According to a further aspect, a driver circuit which is configured to provide a drive voltage to a load (e.g. an SSL device) subject to an input voltage (e.g. a mains voltage) is described. The driver circuit comprises a power converter network comprising an inductor which is coupled to the input voltage. Furthermore, the driver circuit comprises a (source controlled) power transistor having a high voltage terminal which is coupled to the inductor and a low voltage terminal which is coupled to a low voltage potential (e.g. to ground) via a control transistor of a controller. Furthermore, the driver circuit may comprise a controller which is configured to control a state of the power transistor (using the control transistor). The controller may comprise any possible combination of the features described in the present document. In addition, the driver circuit may comprise a supply voltage capacitor which is configured to provide a logic supply voltage to the controller.

The driver circuit may comprise a gate resistor which is arranged between the high voltage terminal of the power transistor and an intermediate voltage terminal of the power transistor. The gate resistor may be configured to derive the gate supply voltage of the (source controlled) power transistor from the voltage at the high voltage terminal of the power transistor. In addition, the driver circuit may comprise a stabilizing capacitor which is arranged between the intermediate voltage terminal of the power transistor and the low voltage potential (e.g. ground). The gate capacitor may be configured to maintain the gate supply voltage at the intermediate voltage terminal of the power transistor (even when the voltage at the high voltage terminal of the power transistor changes). As such, the driver circuit may provide efficient means for providing the gate supply voltage for the (source controlled) power transistor.

The driver circuit may further comprise a Zener function which is arranged between the intermediate voltage terminal of the power transistor and the supply voltage capacitor. The Zener function may be implemented using a Zener diode and/or a MOS transistor and/or a BJT transistor. By way of example, the driver circuit may comprise a Zener diode for providing the Zener function. A breakthrough voltage of the Zener function may depend on a target level of the gate supply voltage and on a target level of the logic supply voltage. In particular, the breakthrough voltage of the Zener function may depend on or may correspond to the target level of the gate supply voltage minus the target level of the logic supply voltage. The breakthrough voltage of the Zener function may be adjustable during operation.

As such, the Zener function may be used to fix the intermediate voltage terminal of the power transistor to the target level of the gate supply voltage (even subject to variations of the voltage at the high voltage terminal of the power transistor). Furthermore, the Zener function may be used as a (re)charging path for charging the supply voltage capacitor in a cost efficient manner.

The driver circuit may further comprise a gate diode which is arranged in series with the gate resistor and which is configured to block a current flowing from the intermediate voltage terminal of the power transistor to the high voltage terminal of the power transistor. The gate diode may be or may comprise an active diode function (comprising e.g. a MOS transistor or a bipolar junction transistor (BJT)). The gate diode may thus prevent a discharging of the intermediate voltage terminal of the power transistor and/or of the stabilizing capacitor.

The driver circuit may comprise a current mirror comprising an input side and an output side. The input side may be arranged between the gate resistor and the intermediate voltage terminal of the power transistor. Furthermore, the driver circuit may comprise a shunt resistor function arranged in series with the output side of the current mirror. The shunt resistor function may comprise a resistor and/or one or more controlled transistors. As such, a voltage drop at the shunt resistor may provide an indication of a voltage level at the high voltage terminal of the power transistor.

Such indication of the voltage level at the high voltage terminal of the power transistor may be provided without the need of an additional auxiliary winding. Hence, the voltage measurement may be performed in a cost efficient manner.

The driver circuit may further comprise a second gate resistor and/or a second gate diode coupled at one side to a voltage measurement point within the driver circuit and coupled on the other side to the input side of the current mirror. By using an additional gate resistor and/or an additional gate diode, a plurality of voltage measurements may be provided at the shunt resistor. The gate diodes may be used to decouple the voltage measurements from one another.

As indicated above, the power transistor may comprise a bipolar transistor with a base. The driver circuit may further comprise a charge pump configured to increase a voltage level of the base of the bipolar junction transistor. In particular, the charge pump may be configured to increase the voltage level of the base of the bipolar transistor within the first time interval (when the charging transistor is in the conduction-state). As such, the charge pump may be used to increase the voltage level of the base such that the voltage level at the charging transistor and/or at the supply voltage capacitor is at or above the logic supply voltage. Hence, by using a charge pump it may be ensured that the supply voltage capacitor is brought up to the logic supply voltage level, even when using a bipolar transistor. The charge pump may comprise a charge pump capacitor. The charge pump capacitor may be (re)charged using the supply voltage capacitor.

According to a further aspect, a light bulb assembly is described. The light bulb assembly comprises an electrical connection module (e.g. a standardized socket) configured to electrically connect to a mains power supply, thereby providing an input voltage waveform. In addition, the light bulb assembly comprises a driver circuit according to any of the aspects outlined in the present document.

According to another aspect, a method for operating a controller and/or a driver circuit as outlined in the present document is described. The method may comprise steps which correspond to the features of the controller and/or driver circuit described in the present document. In particular, the method may be for charging a supply voltage capacitor configured to provide a logic supply voltage to a controller of a driver circuit. The driver circuit may be configured to provide a drive voltage to a load subject to an input voltage. Furthermore, the driver circuit may comprise a power converter network and a (source controlled) power transistor. The method may comprise coupling a low voltage terminal of the power transistor to the supply voltage capacitor within a first time interval, to put the power transistor to a conduction-state. The method further comprises coupling the low voltage terminal of the power transistor directly (i.e. without passing through the supply voltage capacitor) to a low voltage potential (e.g. ground) within a second time interval, to put the power transistor to or to maintain the power transistor within the conduction-state.

According to another aspect, a method for charging a supply voltage capacitor configured to provide a logic supply voltage to a controller of a driver circuit, where the driver circuit is configured to provide a drive voltage to a load subject to an input voltage, where the driver circuit comprises a power converter network and a power transistor, and the method comprises decoupling a low voltage terminal of the power transistor to the supply voltage capacitor within a first time interval, to put the power transistor to an off-state, and decoupling the low voltage terminal of the power transistor directly to a low voltage potential within a second time interval, to put the power transistor to the off-state.

According to another aspect, a driver circuit is configured to provide a drive voltage to a load subject to an input voltage, where the driver circuit comprises a controller for a driver circuit which is configured to provide a drive voltage to a load subject to an input voltage, where the driver circuit comprises a power converter network and a power transistor; where the controller comprises a control transistor which is configured to couple or to decouple a low voltage terminal of the power transistor to or from a low voltage potential, to put the power transistor to a conduction-state or an off-state, respectively, and the controller comprises a charging transistor, arranged in parallel to the control transistor, and configured to couple or to decouple the low voltage terminal of the power transistor to a supply voltage capacitor, to put the power transistor to the conduction-state or off-state, respectively, where the supply voltage capacitor is configured to provide a logic supply voltage to said controller, where the controller is configured to put the power transistor to the conduction-state using the charging transistor within a first time interval, and put the power transistor to the conduction-state using the control transistor within a second time interval, a power converter network comprising an inductor coupled to the input voltage, a power transistor having a high voltage terminal which is coupled to the inductor and a low voltage terminal which is coupled to the low voltage potential via a control transistor of the controller, and, a supply voltage capacitor configured to provide a logic supply voltage to the controller.

According to a further aspect, a software program is described. The software program may be adapted for execution on a processor and for performing the method steps outlined in the present document when carried out on the processor.

According to another aspect, a storage medium is described. The storage medium may comprise a software program adapted for execution on a processor and for performing the method steps outlined in the present document when carried out on the processor.

According to a further aspect, a computer program product is described. The computer program may comprise executable instructions for performing the method steps outlined in the present document when executed on a computer.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the teen "couple" or "coupled" refers to elements being in electrical communication with each other, whether directly connected e.g., via wires, or in some other manner.

BRIEF DESCRIPTION OF THE FIGURES

The invention is explained below in an exemplary manner with reference to the accompanying drawings, wherein.

DESCRIPTION

In the present document, a light bulb "assembly" includes all of the components required to replace a traditional incandescent filament-based light bulb, notably light bulbs for connection to the standard electricity supply. In British English (and in the present document), this electricity supply is referred to as "mains" electricity, whilst in US English, this supply is typically referred to as power line. Other terms include AC power, line power, domestic power and grid power. It is to be understood that these terms are readily interchangeable, and carry the same meaning.

Typically, in Europe electricity is supplied at 230-240 VAC, at 50 Hz and in North America at 110-120 VAC at 60 Hz. The principles set out in the present document apply to any suitable electricity supply, including the mains/power line mentioned, and a DC power supply, and a rectified AC power supply.

Figure 1:
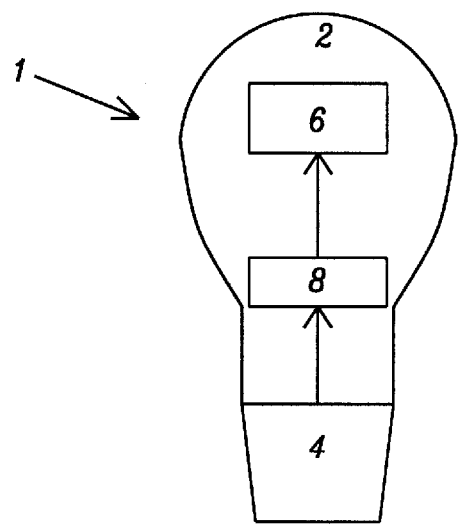
FIG. 1 illustrates a block diagram of an example light bulb.

FIG. 1 is a schematic view of a light bulb assembly. The assembly 1 comprises a bulb housing 2 and an electrical connection module 4. The electrical connection module 4 can be of a screw type or of a bayonet type, or of any other suitable connection to a light bulb socket. Typical examples for an electrical connection module 4 are the E11, E14 and E27 screw types of Europe and the E12, E17 and E26 screw types of North America. Furthermore, a light source 6 (also referred to as an illuminant) is provided within the housing 2. Examples for such light sources 6 are a CFL tube or a solid state light source 6, such as a light emitting diode (LED) or an organic light emitting diode (OLED) (the latter technology is referred to as solid state lighting, SSL). The light source 6 may be provided by a single light emitting device, or by a plurality of LEDs.

Driver circuit 8 (also referred to as power supply arrangement in the present document) is located within the bulb housing 2, and serves to convert supply electricity received through the electrical connection module 4 into a controlled drive current for the light source 6. In the case of a solid state light source 6, the driver circuit 8 is configured to provide a controlled direct drive current to the light source 6.

The housing 2 provides a suitably robust enclosure for the light source and drive components, and includes optical elements that may be required for providing the desired output light from the assembly. The housing 2 may also provide a heat-sink capability, since management of the temperature of the light source may be important in maximising light output and light source life. Accordingly, the housing is typically designed to enable heat generated by the light source to be conducted away from the light source, and out of the assembly as a whole.

In order to make an SSL based lamp compatible with phase-cut dimmers, the power supply arrangement 8 for such an SSL based lamp 1 may provide e.g. the following functions:

1. Take energy from the mains voltage set by the dimmer.
2. Filter any voltage fluctuation at the mains supply in order to keep the light output free of flicker.
3. Adjust the SSL lamp current/power (and by consequence the intensity of the emitted light) to the requested dim level.

Among other things, the present document describes methods and systems which allow for the implementation of one or more of the above mentioned functions. In the following, such methods and systems will be described in the context of LED lamps. It should be noted, however, that the methods and systems described herein are equally applicable to controlling the power provided to other types of illumination technologies such as other types of SSL based lamps (e.g. OLEDs).

Figure 2:
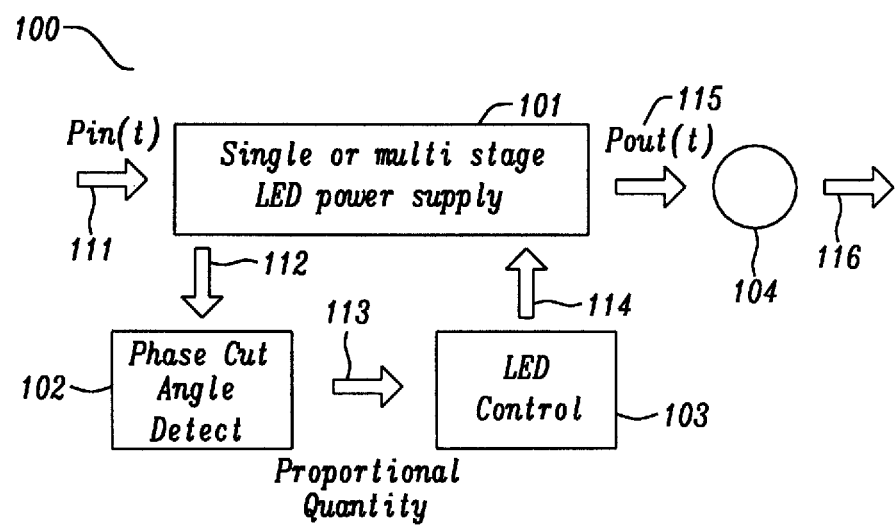
FIG. 2 illustrates example power supply arrangements for an LED lamp.

FIG. 2 illustrates a block diagram of a power supply arrangement 100 which may be used to control the power for illuminating the LED device 104 based on the power provided by the mains power supply. The power supply arrangement 100 receives an input power 111 from the mains supply. The input power 111 may have been adjusted using a dimmer. Various types of dimmers exist, but the most frequently used type of dimmer is a so-called thyristor dimmer or phase-cut dimmer. Thyristor dimmers switch on at an adjustable time (phase angle) after the start of each alternating current half-cycle, thereby altering the voltage waveform applied to lamps and so changing its root mean squared (RMS) effective voltage value. Because thyristor dimmers switch part of the voltage supplied (instead of absorbing it), there is very little wasted power at the dimmer. Dimming can be performed almost instantaneous and is easily controlled by remote electronics. Typically, TRIACs (Triode for Alternating Current) are used as thyristors within the dimmers in domestic lightening application. Variants of dimmers are leading edge phase-cut dimmers, trailing edge phase-cut dimmers or intelligent dimmers configured to switch between leading edge and/or tailing edge phase-cut. The methods and systems described herein are applicable to any of the above mentioned variants of dimmers. Furthermore, the methods and systems described in the present document are applicable to digital dimmers and/or phase-cut dimmers special for LEDs with e.g. a 150 W limiting output.

As such, phase-cut dimmers are typically configured to remove a particular phase of the sinusoidal mains voltage. This leads to a reduction of the RMS voltage supplied to conventional incandescent lamp, thereby reducing the intensity of the light emitted by the incandescent lamp. On the other hand, energy efficient illumination technologies such as LED or OLED require a pre-determined level of direct current (DC) voltage, such that the modifications to the sinusoidal mains voltage performed by the dimmer cannot be directly used for modifying the intensity of the emitted light. Consequently, power supply arrangements or driver circuits for such energy efficient lamps typically comprise means for converting the phase-cut input voltage into an appropriately reduced power for the illuminant (e.g. the LED or OLED).

Returning now to the example power supply arrangements or driver circuit 100 of FIG. 2. The example power supply arrangement 100 comprises a phase-cut angle detection unit 102 which senses the input voltage 112 and which estimates the angle at which the original sinusoidal mains voltage has been cut by the dimmer. The estimated angle 113 indicates a desired dim level and is passed to an LED control unit 103 which controls the LED power supply 101 via a control signal 114 to provide an output power 115 to the LED 104 (referred to as light source 6 in FIG. 1) which drives the LED 104 to provide light 116 at the desired dim level.

As indicated above, the present document deals with the problem of detecting the phase-cut angle under various conditions of the light bulb assembly. In order to measure the actual dimming phase-cut angle, a discharge or bleeder current may be used to reset the voltage across the mains input terminal of the light bulb assembly 1 (i.e. the input voltage) to zero in phases where the dimmer switching element (e.g. the TRIAC) is in its off-state. If no reset current is drawn, the voltage at the mains voltage terminal of the light bulb assembly discharges at a slow rate and no instantaneous voltage change is visible at the input. As a consequence, phase-cut angles are typically difficult to detect.

The discharge or bleeder current may be selected to be large enough to ensure a proper discharge within a limited time window. In particular, the discharging should be terminated prior to the time instant when the dimmer switches on, thereby enabling the detection of the phase-cut angle. Furthermore, the discharge current should not contribute to the energy intake of the power converter from the mains supply, in order to avoid any light output modulation or excess voltage increase in the power converter. In other words, the energy intake of the power converter may be decoupled from the discharge current, thereby avoiding modulations of the drive current and/or drive voltage supplied to the light source 6, 104. Furthermore, the discharge current may be limited to a maximum value in order to avoid an overstress of components within the light bulb assembly 1 and in particular within the driver circuit of the light bulb assembly.

Figure 3A:
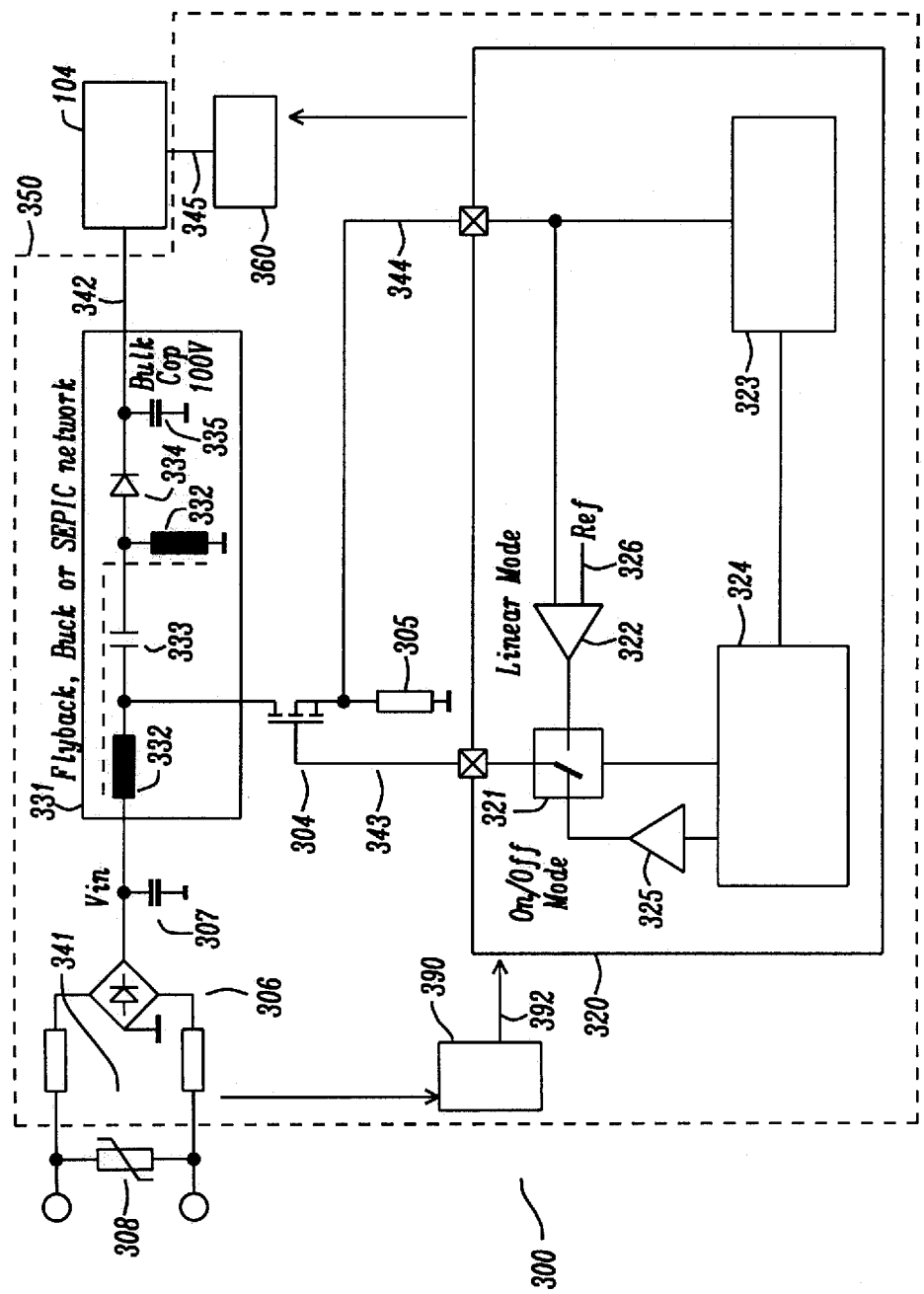
FIG. 3a shows a block diagram of an example driver circuit for an SSL lamp.

FIG. 3a illustrates an example system 300 for controlling the illumination level of an SSL device 104 based on a dimmer controlled input voltage 341. The input voltage 341 is provided by a mains voltage power supply in combination with a dimmer (combined reference numeral 308). A driver circuit 350 is used to generate a drive voltage 342 and a drive current 345. The drive voltage 342 is typically a substantially constant voltage corresponding to the on-voltage of the SSL device 104. The drive current 345 is typically a substantially constant current set in accordance to an intended illumination level of the SSL device 104.

The driver circuit 350 may comprise a rectifier unit 306 configured to provide a rectified version of the input voltage 341. The rectifier unit 306 may comprise a half-wave or a full-wave rectifier. Furthermore, the rectifier unit 306 may comprise EMI (electromagnetic interference) filter components. Typically, the rectifier unit 306 is used in conjunction with a stabilizing capacitor 307 which is used to smoothen the rectified input voltage.

Furthermore, the driver circuit 350 typically comprises a power converter network 331. In the illustrated example, the power converter network 331 is a SEPIC (Single-Ended Primary-Inductor Converter) network comprising the coils 332, the capacitors 333, 335 and the diode/switch 334. Alternative structures for the power converter network 331 are e.g. a buck converter network or a fly back converter network. The power converter network 331 may implement—in combination with the power switch 304—a switched-mode power converter configured to transfer energy from the input voltage 341 to the load 104. In particular, the power converter 331, 304 may be operated such that the rectified input voltage is converted into a substantially constant drive voltage 342 for the SSL device 104.

As outlined above, the switch 304 may be operated in a first mode (also referred to as the on/off mode or the switched mode) where the switch 304 is alternated between its on-state and its off-state at a predetermined commutation cycle rate and at a predetermined duty cycle (wherein the duty cycle defines the fraction of the on-state within a commutation cycle). The commutation cycle rate and the duty cycle may be used to control the conversion ratio of the power converter 331, 304. Furthermore, the switch 304 may be operated in a second mode (also referred to as the linear mode) where the switch 304 is controlled to allow for a predetermined drain-source current through the switch 304. In other words, in the second mode, the switch 304 may be operated as a variable resistor. The current through the switch 304 may be used to reset the (rectified) input voltage 341. In particular, the current through the switch 304 may be used to discharge the stabilizing capacitor 307, thereby enabling access to the "un-smoothened" (rectified) input voltage 341 and thereby enabling a reliable measurement of the phase-cut angle.

The first and second mode of the switch 304 may be controlled via the (gate) control signal 343 generated by the control unit 320. The control unit 320 may comprise a mode selector 321 which is configured to switch between a first control signal generation unit 325 configured to generated the control signal 343 for the first mode of the switch 304 and a second control signal generation unit 322 configured to generate the control signal 343 for the second mode of the switch 304. A control logic 324 may be used to control the mode selector 321 based on the feedback signal 344, wherein the feedback signal 344 may be indicative of the current through the switch 304. By way of example, the current through the switch 304 may be sensed by a sensing resistor 305, thereby providing a voltage drop at the sensing resistor 305 which is proportional to the current through the switch 304. In the illustrated example, the feedback signal 344 corresponds to the voltage drop across the sensing resistor 305 and is therefore proportional to the current through the switch 304.

In order to operate the switch 304 in the first mode, the control logic 324 sets the mode selector 321 such that the gate of the switch 304 is coupled to the first control signal generation unit 325 which comprises e.g. an operational amplifier. Furthermore, the control logic 324 may be configured to provide a pulse width modulated signal which is converted by the first control signal generation unit 325 into a control signal 343 which puts the switch 304 into alternating on/off states at the pre-determined commutation cycle rate and at the pre-determined duty cycle.

In order to operate the switch 304 in the second mode, the control logic 324 sets the mode selector 321 such that the gate of the switch 304 is coupled to the second control signal generation unit 322 which comprises e.g. a comparator. The comparator may be used to implement a feedback loop using the feedback signal 344, thereby determining the control signal 343 such that the feedback signal 344 corresponds to a pre-determined reference signal 326. In particular, the control signal 343 may be determined such that the current through the switch 304 corresponds to a pre-determined discharge current. The pre-determined discharge current may be selected such that the components of the driver circuit 350 (notably of the power converter network 331 and of the rectifier 306) are protected from overstress and/or that the discharging is performed within a pre-determined discharge time interval. Typically, the pre-determined discharge current will be determined based on a compromise between overstress protection and discharge time interval. By way of example, the pre-determined discharge current may be in the range of 10 mA or 100 mA.

The control unit 320 may further comprise a feedback processing module 323 configured to analyze the feedback signal 344. The feedback processing module 323 may be configured to determine that the feedback signal 344 exceeds a pre-determined feedback threshold. This situation may be indicative of the fact that the dimmer 308 goes into on-state, thereby providing an input voltage 341 with a magnitude greater than a pre-determined input voltage threshold (e.g. zero). In other words, this situation may be indicative of a phase-cut angle within the input voltage 341. The feedback processing module 323 may indicate this situation to the control logic 324.

The control logic 324 may determine a phase-cut time interval indicative of the phase-cut angle. The phase-cut time interval may correspond to the time interval between the time instant when the switch 304 was put into the second mode and the time instant when the feedback processing module 323 detected the feedback signal 344 exceeding the pre-determined feedback threshold (i.e. the time instant when the dimmer 308 switches on). Furthermore, the control logic 324 may control the switch 304 to be operated in the first mode, subject to the feedback processing module 323 detecting that the feedback signal 344 exceeds the pre-determined feedback threshold. In other words, if it is detected that the dimmer 308 switches on, the control logic 324 may control the mode selector 321 to put the switch 304 into the first mode.

Furthermore, the driver circuit 350 of FIG. 3a may comprise input voltage measurement means 390 (e.g. a voltage divider). The input voltage measurement means 390 may be configured to provide a voltage 392 derived from the input voltage 341 to the control unit 320. The control unit 320 may comprise a pin to receive the voltage 392.

The bleeder current may be generated in various different manners. By way of example, the bleeder current may be increased (e.g. from zero) and/or decreased (e.g. to zero), in order to prevent current spikes. The control unit 320 may be configured to operate the power switch 304 in the second mode accordingly. Alternatively or in addition, the bleeder current may only be generated at relatively low levels of the input voltage and/or the bleeder current may only be generated for a fraction of the cycles of the mains voltage. This may be beneficial to reduce power losses of the power switch 304.

Figure 3B:
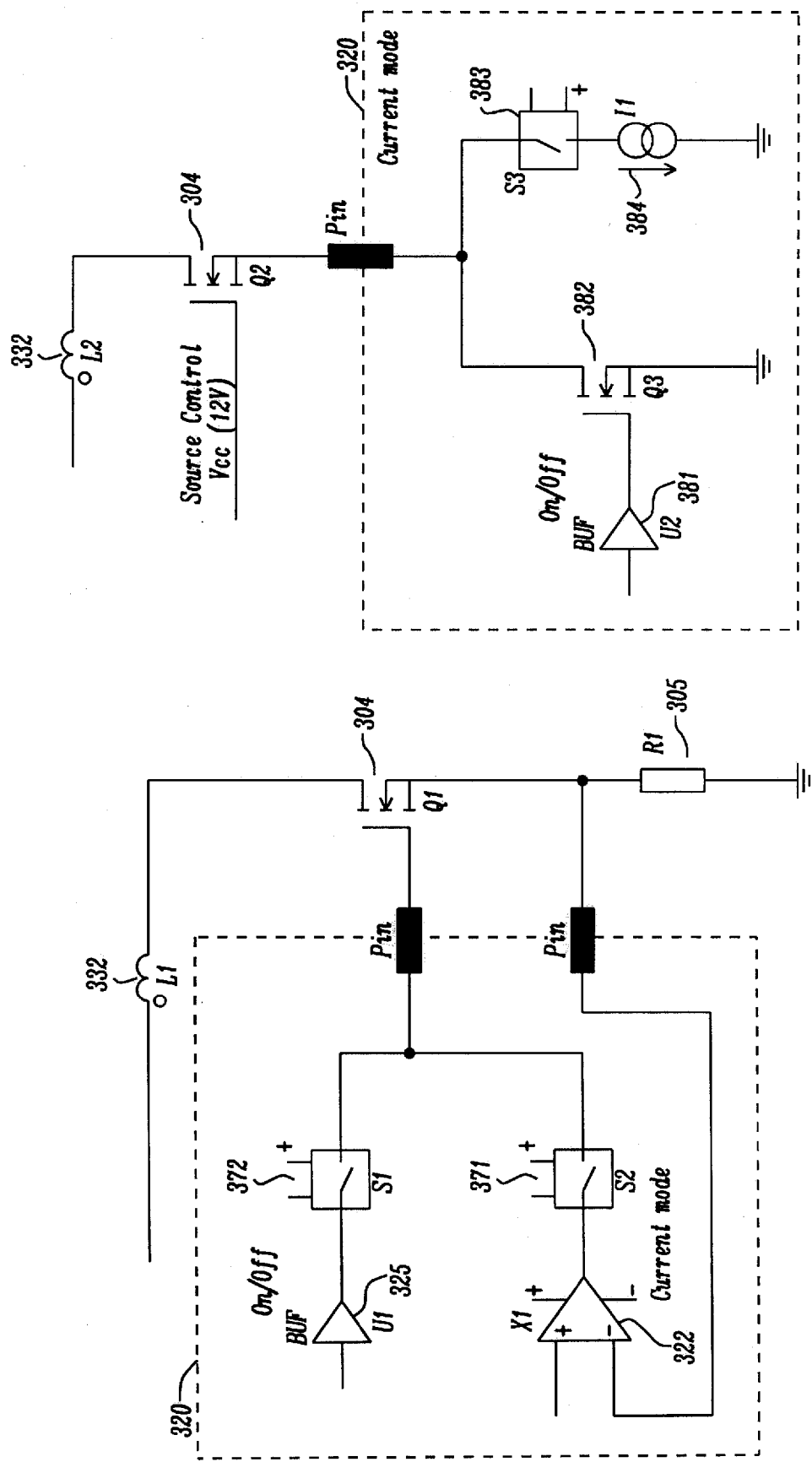
FIG. 3b shows block diagrams of example control units or controllers of a driver circuit.

FIG. 3b illustrates block diagrams of example control units 320 for a driver circuit 350. The control unit 320 of FIG. 3b (left hand side) corresponds to the control unit 320 shown in FIG. 3a. Furthermore, the control unit 320 of FIG. 3b (left hand side) comprises a switch 372 configured to provide the pulse width modulated control signal to the switch 304, for operating the switch 304 in an on/off mode. In addition, control unit 320 of FIG. 3b (left hand side) comprises a transistor 371 configured to control the gate control signal 343 of the switch 304, thereby controlling the current through the switch 304.

FIG. 3b (right hand side) shows a block diagram of an example control unit 320 which may be used in conjunction with a source-controlled switch 304. In this case, the switch 304 may have the function of a level shifter which is controlled via its source. The switch 304 of FIG. 3*b* (right hand side) is coupled to a gate supply voltage Vcc (e.g. Vcc=12V). The control unit 320 comprises a first branch comprising a PWM driver 381 and a PWM control switch 382 operated in an on/off mode. Furthermore, the control unit 320 comprises a second branch comprising a switch 383 and a current source 384. The first branch may be used to operate the switch 304 in the first mode (i.e. in the on/off mode). The second branch may be used to operate the switch 304 in the second mode (i.e. in the linear mode). The current through the switch 304 may be fixed using the current source 384. When operated in the second mode, the switch 382 of the first branch may be kept in an off state. On the other hand, when operated in the first mode, the switch 383 may be kept in an off state. The control unit 320 may be advantageous as it does not comprise a control loop, and/or as it makes use of a reduced number of pins.

It should be noted that in the case of the example control unit 320 of FIG. 3*b* (right hand side) an indication of the input voltage 341 may be measured at the pin of the control unit 320, i.e. at the source of the switch 304. In particular, it may be measured that the voltage at the drain of the switch 304 drops below the gate supply voltage Vcc. Furthermore, it may be measured that the current source 384 is saturated. As such, the cycle of the mains voltage may be detected at the pin of the control unit 320.

In the following, power converters 331, 304 with source controlled power switches 304 are analyzed in further detail. Typically, the control unit or controller 320 of a driver circuit 350 is provided with electrical energy at the voltage level of a logic supply voltage. The logic supply voltage may be lower than the above mentioned gate supply voltage Vcc which is applied to the gate of a source controlled power switch 304. The logic supply voltage may be provided by a supply voltage capacitor 420 (shown in FIG. 4). The supply voltage capacitor 420 may be coupled to a supply voltage pin of the control unit 320.

Figure 4:
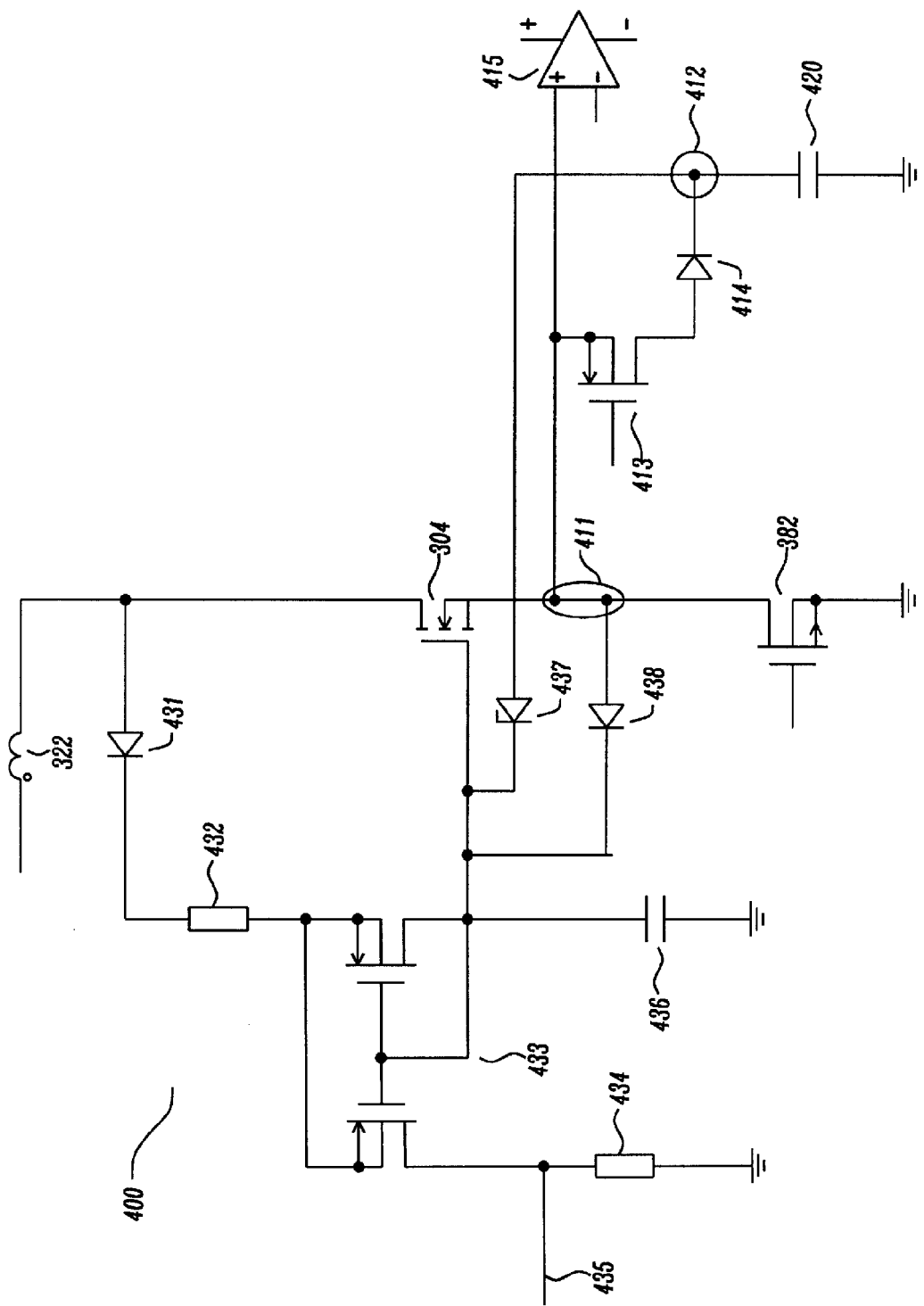
FIG. 4 shows a block diagram of excerpts of an example driver circuit.

At the start-up of the driver circuit 350, the supply voltage capacitor 420 is typically uncharged. Hence, upon start-up of the driver circuit 350, the supply voltage capacitor 420 may need to be charged. FIG. 4 shows a circuit 400 which may be used to charge the supply voltage capacitor 420 using the current flowing through the source controlled power switch 304. The circuit 400 comprises a charging switch 413 which is configured to couple the source of the power switch 304 with ground via the supply voltage capacitor 420. Upon start-up, the charging switch 413 may be closed such that the source of the power switch 304 is coupled to ground, thereby closing the power switch 304. This results in an inductor current flowing through the inductor 322 and through the power switch 304. If the control switch 382 is open (i.e. in off-state), the current through the power switch 304 flows through the charging switch 413 into the supply voltage capacitor 420, thereby charging the supply voltage capacitor 420. The optional charging diode 414 may be used to block a reverse current from the supply voltage capacitor 420 to the power switch 304.

Once a voltage drop at the supply voltage capacitor 420 reaches a pre-determined voltage level (e.g. the level of the logic supply voltage), the charging switch 413 may be opened and the control switch 382 may be closed. In particular, subsequent to the start-up and to the charging of the supply voltage capacitor 420, the control switch 382 may be operated in a switched mode, in order to operate the power switch 304 in the first mode.

FIG. 4 shows pins 411, 412 of the control unit 320, i.e. the control switch 382 and the charging switch 413 may be implemented as part of the control unit 320 (e.g. as part of an integrated circuit).

During operation, the control unit 320 consumes energy which is drawn from the supply voltage capacitor 420. As a result of this, the level of the voltage drop at the supply voltage capacitor 420 may reduce. The charging switch 414 may be configured to and may be operated to recharge the supply voltage capacitor 420. The recharging of the supply voltage capacitor 420 may be performed in a periodic manner (e.g. in accordance to the commutation cycle rate of the power converter 304, 331 and/or of the power switch 304, when operated in the first mode). A commutation cycle of the power switch 304 typically comprises a first phase during which the power switch 304 is closed and a second phase during which the power switch 304 is open. When closing the power switch 304, an inductor current ramps up with a pre-determined ramp, wherein the pre-determined ramp depends on the inductance of the inductor 322. At the beginning of a ramp, the inductor current is typically zero and gradually increases up to a peak current. When the power switch 304 is closed, the inductor current flows through the power switch 304.

In a similar manner to the start-up phase, the current through the power switch 304 may be used to recharge the supply voltage capacitor 420 using the charging switch 413. For this purpose, the first phase of the commutation cycle may be subdivided into a first sub-phase during which the charging switch 413 is closed, in order to control the power switch 304 to go into the on-state, and in order to direct the current through the power switch 304 to the supply voltage capacitor 420 for recharging the supply voltage capacitor 420. During the first sub-phase the control switch 382 is typically kept open.

Once the voltage drop at the supply voltage capacitor 420 has reached a pre-determined level (e.g. the level of the logic supply voltage), the charging switch 413 may be opened, and the control switch 382 may take over the control of the power switch 304. In particular, the control switch 382 may be closed for a second sub-phase of the first phase of the commutation cycle, in order to maintain the power switch 304 in the on-state. Furthermore, at a later stage, the control switch 382 may be opened, in order to put the power switch 304 into the off-state (for a second phase of the commutation cycle).

Figure 8:
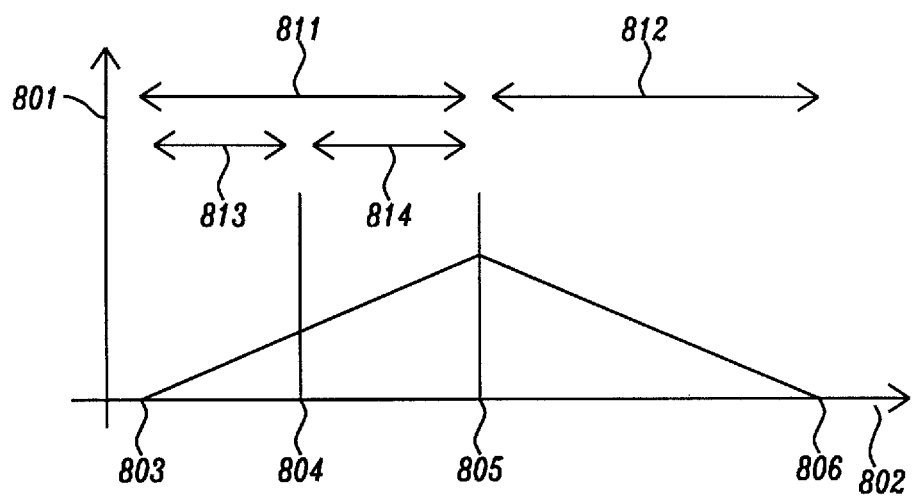
FIG. 8 shows example phases of a commutation cycle.

FIG. 8 illustrates the inductor current 801 as a function of time 802 for a commutation cycle of the power switch 304 (when operated in the first, i.e. in the switched, mode). At time instant 803 at the beginning of the first phase 811 of the commutation cycle (and at the beginning of the first sub-phase 813 of the first phase 811), the charging switch 413 is closed (while the control switch 382 is maintained open), in order to put the power switch 304 in the on-state. As a result of closing the power switch 304, the inductor current 801 builds up with a pre-determined ramp. During the first sub-phase 813, the current through the power switch 304 (i.e. the inductor current 801) may be used to recharge the supply voltage capacitor 420. At the time instant 804 it is determined that the voltage drop at the supply voltage capacitor 420 has reached a pre-determined target level. As a result of this, the charging switch 413 is opened and the control switch 382 is closed in order to proceed with the first phase 811 of the commutation cycle (within a second sub-phase 814 of the first phase 811).

The control switch 382 is maintained closed until the time instant 805 (e.g. when the inductor current 801 has reached a pre-determined peak level). As a result of this, the power switch 304 is put into the off-state for the second phase 812 of the commutation cycle. Then the inductor 322 transfers energy towards the output of the power converter 331, 304.

The recharging process of the supply voltage capacitor 420 may be repeated on an "as needed" basis, e.g. when the voltage level at the supply voltage capacitor 420 falls below a pre-determined lower threshold. Alternatively or in addition, the recharging process may be repeated in a periodic manner (e.g. within every commutation cycle or within a fraction of the commutation cycles).

As such, the recharging switch 413 may be used to maintain the energy within the supply voltage capacitor 420 in an efficient manner, using the inductor current 801. In other words, circuit 400 shows an efficient scheme for maintaining the logic supply voltage based on the inductor current 801. Circuit 400 does not make use of an auxiliary winding, i.e. of a winding which is magnetically coupled to the inductor 322. Hence, circuit 400 allows for a cost efficient recharging of the supply voltage capacitor 420.

As indicated above, the power switch 304 may be operated in a first (i.e. switched) mode and/or in a second (i.e. linear) mode. When operated in the second mode, the power switch 304 may be used to draw a bleeder current, in order to discharge one or more capacitances 307 at the input of the driver circuit 350, and in order to allow for a reliable firing of a dimmer 308. The charging switch 413 may be used to control the power switch 304 in a linear mode (e.g. while the control switch 382 is maintained open). As a result of this, the bleeder current through the power switch 304 may be used to recharge the supply voltage capacitor 420. Hence, the recharging of the supply voltage capacitor 420 may be performed in a power efficient manner, because the bleeder current would otherwise be lost.

The control unit 320 of FIG. 4 further comprises a comparator unit 415. The comparator unit 415 may be configured to compare the voltage at the source of the power switch 304 with a reference voltage. This may be beneficial for performing freewheeling detection, i.e. for detecting the time instant when the inductor 322 has released all the stored energy. As shown in FIG. 8, the inductor current 801 ramps up during the first phase 811 of a commutation cycle (when the power switch 304 is in on-state). As a result of this, energy is stored within the inductor 322. During the second phase 812 of the commutation cycle (when the power switch 304 is in off-state), the inductor current 801 decreases, thereby releasing the stored energy towards the output of the power converter network 331. The time instant 806, when the inductor current 801 falls to zero, i.e. when all the stored energy has been released, may be referred to as the time instant when freewheeling of the inductor 322 occurs. It may be beneficial to detect the time instant 806, e.g. for triggering a next commutation cycle of the power switch 304.

Freewheeling of the inductor 322 (e.g. the transformer 322) typically leads to a transient of the voltage level at the drain of the power switch 304. Due to one or more parasitic capacitances of the power switch 304, notably due to a parasitic drain-source capacitance of the power switch 304, the transient of the voltage level at the drain of the power switch 304 may be coupled to the source of the power switch 304. As a result of this, the transient of the voltage level at the drain may be detected at the source of the power switch 304 (using e.g. the comparator 415). In particular, oscillations of the voltage at the source of the power switch 304 (when the power switch 304 is in off-state) may be measured. This is beneficial, because this allows freewheeling detection at relatively low voltage levels (compared to freewheeling detection which is based directly on the voltage level at the inductor 322 or at the drain of the power switch 304). Furthermore, this allows freewheeling detection to be performed without the use of an auxiliary winding. As a consequence, the circuit 400 provides cost efficient means for measuring freewheeling.

The circuit 400 of FIG. 4 further comprises circuitry for maintaining the gate of the power switch 304 at the pre-determined gate supply voltage Vcc (e.g. at 12V or at 15V). For this purpose, the circuit 400 may comprise a Zener diode 437. The Zener diode 437 may have a breakdown voltage which depends on the gate supply voltage Vcc to be applied to the gate of the power switch 304. In the illustrated example, the Zener diode 437 is arranged in series with the supply voltage capacitor 420, wherein the supply voltage capacitor 420 may be at the level of the logic supply voltage (e.g. 5V). Hence, the breakdown voltage of the Zener diode 437 may correspond to the gate supply voltage Vcc (e.g. 15V) minus the logic supply voltage (e.g. 5V). It should be noted that the path of the Zener diode 437 may be used as an additional path for recharging the supply voltage capacitor 420.

The gate supply voltage Vcc may be derived from the drain of the power switch 304 via the gate diode 431 (for preventing a reverse current) and via the resistor 432 (referred to herein as the gate resistor or the measurement resistor). The gate supply voltage Vcc may be stabilized using the capacitor 436 (referred to herein as the gate capacitor).

Circuit 400 further comprises circuitry for measuring the voltage level at the drain of the power switch 304. Using the current mirror 433 and the reverse protection diode 438 the voltage at the drain of the power switch 304 may be measured at the pin 435 using the shunt resistor 434. Hence, the current which is used for maintaining the gate supply voltage Vcc for the gate of the power switch 304 and/or for recharging the supply voltage capacitor 420 may also be used for measuring the level of the voltage at the drain of the power switch 304. It should be noted that the measurement of the drain voltage may be performed without using an auxiliary winding of a transformer 322. Hence, the measurement of the drain voltage may be performed in a cost efficient manner.

In other words, the circuit 400 shown in FIG. 4 comprises a source controlled external power switch 304 (e.g. a MOS transistor, notably an NMOS), for shielding the high voltage at the inductor 322 from the rest of the circuit (notably from the control unit 320). The power converter network 331 may comprise a fly back power converter and the switching function of the fly back converter may be achieved by using the control switch 382 to control the switching state of the power switch 304 and to thereby energize the inductor 322. The gate of the power switch may be held at a fixed gate supply voltage Vcc which is defined by the breakdown voltage of the Zener diode 437 and by the logic supply voltage held at the supply voltage capacitor 420.

When the power switch 304 is turned off (i.e. when the control switch 382 is turned off) the fly back voltage at the inductor 322 (i.e. the voltage level at the drain of the power switch 304) may be measured via gate resistor 432. The current through the gate resistor 432 may also be used to recharge the external supply voltage capacitor 420 using the Zener diode 437, which is referenced to the logic supply voltage. Using the current mirror 433 and the reverse protection diode 438, the current through the gate resistor 432 can be measured. Knowing the resistor value of gate resistor 432, the voltage drop at the gate resistor 432 can be determined. As such, the voltage level at the inductor 322 may be measured (e.g. at the measurement pin 435). The voltage drop at the additional elements will typically only generate a small (reasonably fixed) error, because the drop at the gate resistor 432 is typically substantially larger (e.g. in the order of 100's of volts). An error term can be adjusted for and removed from the measured result.

The control switch 382 and the charging switch 413 may control the power converter in a normal operating mode (e.g. in the first mode). In the case that the logical supply voltage at the supply voltage capacitor 420 falls below a predetermined threshold, the charging switch 414 may be switched on in one of the next converter periods (also referred to as commutation cycles) to couple the source of the power switch 304 with the supply voltage capacitor 420 and in order to recharge the supply voltage capacitor 420. In this operation mode, the Z function voltage (i.e. the breakdown voltage of the Zener diode 457) may be increased to ensure a sufficiently high gate supply voltage Vcc at the gate of the external power switch 304. This voltage can then be reduced again in normal operation.

As indicated above, the Z function conduction (via the Zener diode 437) may provide an additional charging path for the supply voltage capacitor 420. The charging current will typically be limited by the gate resistor 432, which may be in the range of 500 kOhm, thereby limiting the current through the gate resistor 432 to the range of 500 μA.

Freewheeling may be detected via the parasitic drain/source capacitance of the external power switch 304. In the case of a drain voltage swing at the drain of the power switch 304, the transient signal may be transferred to the source of the power switch 304 and the comparator 415 at the source of the power switch 415 may be used to detect the transient signal.

The circuit 400 enables CDSM (critical discontinuous switching mode) of the power converter network 331, which may be required for optimum efficiency.

Figure 5:
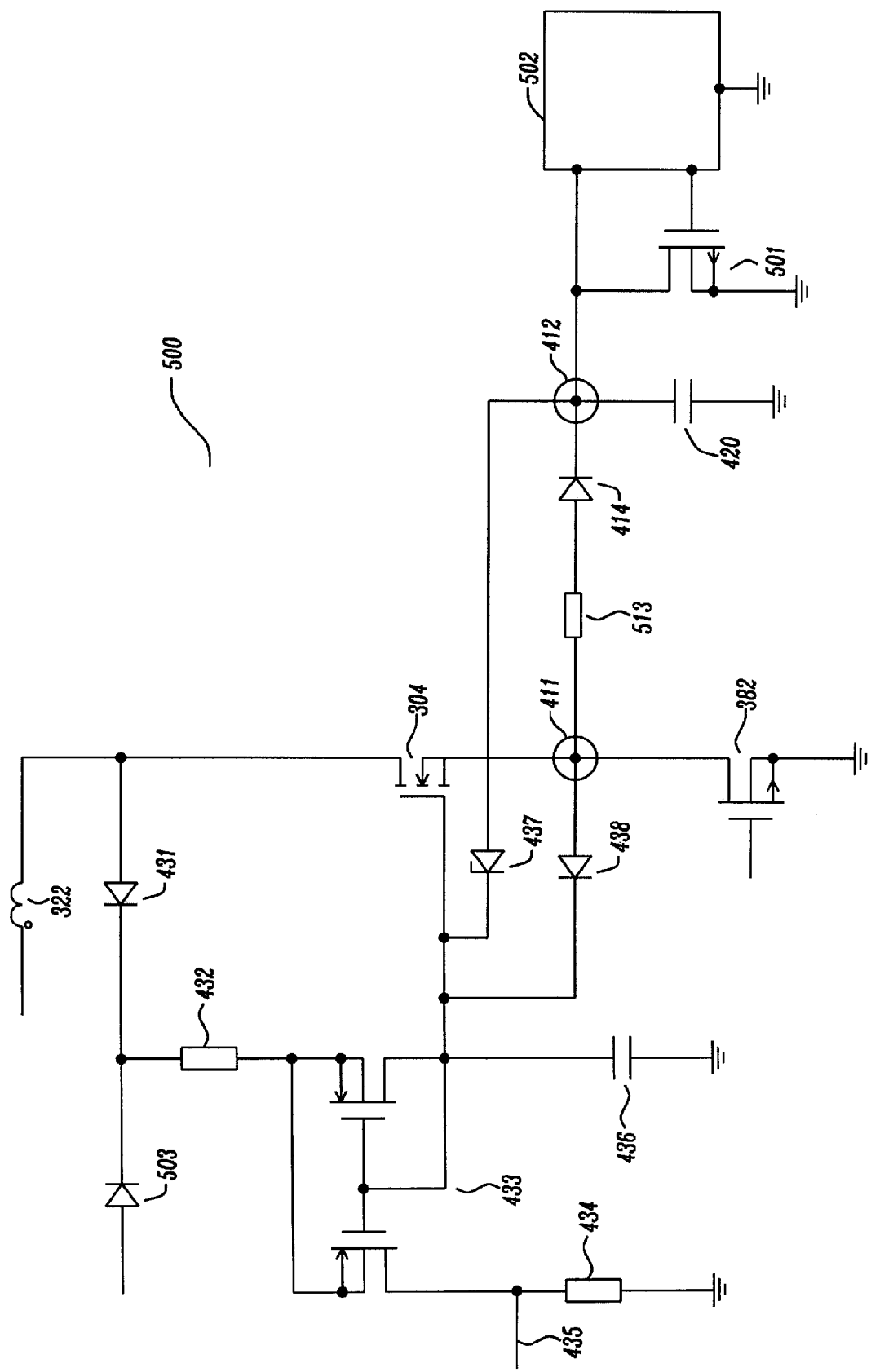
FIG. 5 shows a block diagram of excerpts of another example driver circuit.

FIG. 5 shows a circuit diagram of a circuit 500 which may be used to allow for multiple high voltage measurements. The circuit 500 may comprise an additional diode 503, which may be linked to another (high voltage) node of the driver circuit 330. Using the two diodes 503, 431 two different voltage levels may be measured at the measurement pin 435.

During the charging phase of the inductor 322, i.e. during the first phase 811 of the commutation cycle, the power switch 304 is in the on-state and therefore pulls the first diode (also referred to as the first measurement diode or first gate diode) 431 to ground. As a result of this, the first measurement diode 431 is reverse biased and does not conduct anymore. This allows for a measurement via the second measurement diode 503. In particular, the deactivation of the first measurement diode 431 during the first phase 811 of the commutation cycle may active the second measurement diode 503.

On the other hand, when the power switch 304 is turned off, the voltage on the first measurement diode 431 and the voltage at the second measurement diode 503 may be combined and a combined voltage (e.g. the sum of the voltages) may be measured at the measurement pin 435. This switching function may be used to separate the two different measurements by taking into account the state of the power switch 304. Using this information, the system can resolve the two separate voltages.

As indicated above, the supply voltage capacitor 420 may be charged during the switching phases of the power switch 304. In FIG. 5, the charging switch 413 is represented as a variable resistor 513. By altering the value of the variable resistor 513 to a low value, the first part 813 of a switching pulse (notably the first sub-phase 813 of the first phase 811 of the commutation cycle) may be used to charge the supply voltage capacitor 420 via the charging diode 414. Subsequently, the control switch 382 may be used to complete the energizing of the inductor 332. The value of the variable resistor 513 may depend on the required charge for recharging the supply voltage capacitor 420. Hence, the value of the variable resistor 513 (e.g. the value of the on-resistance of the charging switch 413) may be modified in dependence of the required charge for the supply voltage capacitor 420. The circuit 500 may comprise a shunt regulator 501, 502 to limit the charging of the supply voltage capacitor 420 and to protect the supply voltage capacitor 402 against over-voltage supply. An additional comparator across the variable resistor 413, 513 may be used to detect errors during the energy transfer.

Figure 6:
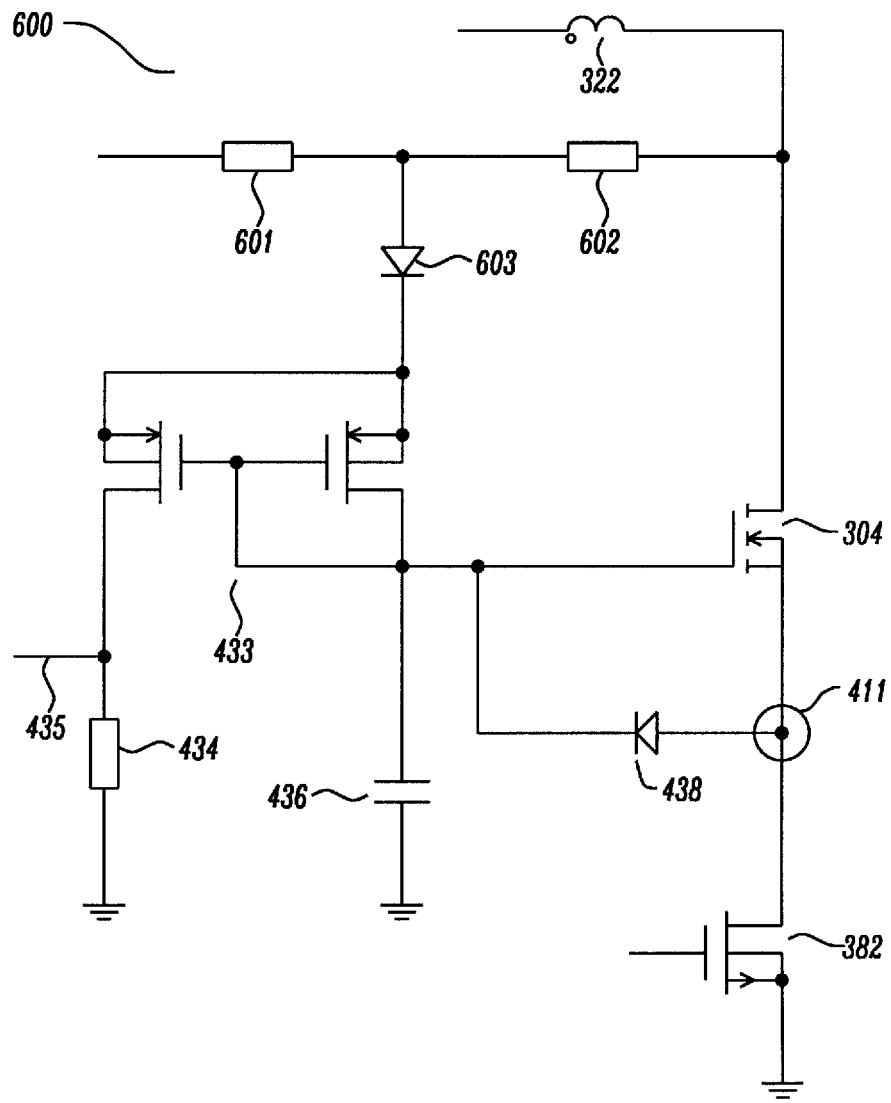
FIG. 6 shows a block diagram of excerpts of a further example driver circuit.

FIG. 6 shows a circuit 600 which comprises measurement or gate resistors 601, 602 and a measurement diode 603 for measuring high voltages. The measurement diode 603 does not need to sustain high voltages, because the majority of the voltage drop remains at the measurement resistors 601, 602. This may be achieved by exchanging the order of the measurement diode and the measurement resistors. By using the measurement resistors 601, 602, the measurement diode 603 is only submitted to a reverse voltage of about 10 to 20V (for voltage at the inductor 322 in the range of 300V). As a result of this, the measurement diode 603 may be integrated using a low voltage technology. This may require separate pins. However one pin may be used for two external low-voltage diodes.

Figure 7:
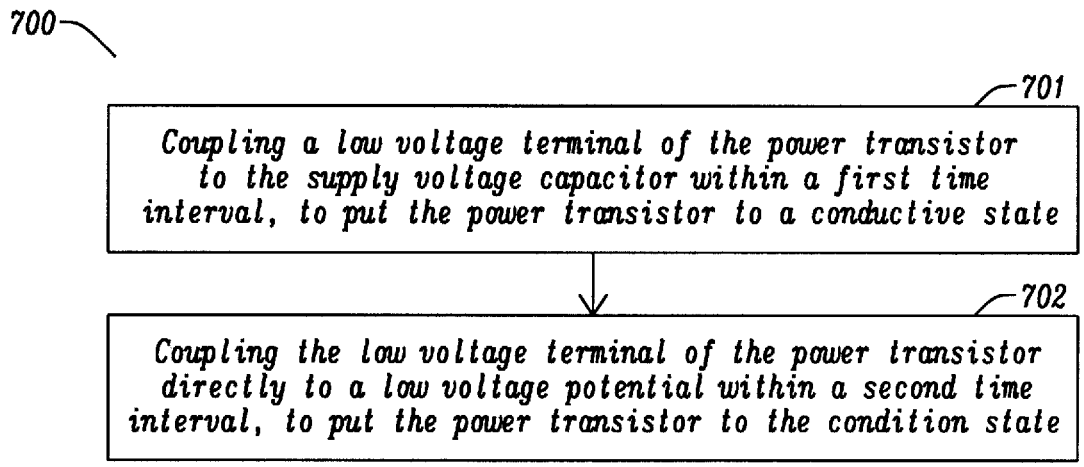
FIG. 7 shows a flow chart of an example method for recharging a supply voltage capacitor.

FIG. 7 shows a flow chart of an example method 700 for charging a supply voltage capacitor 420 configured to provide a logic supply voltage to a controller 320 of a driver circuit 350. The driver circuit 350 is configured to provide a drive voltage 342 to a load 104 subject to an input voltage 341. Furthermore, the driver circuit 350 comprises a power converter network 331 and a source controlled power transistor 304. The method 700 comprises coupling 701 a source of the power transistor 304 to the supply voltage capacitor 420 within a first time interval 813, to put the power transistor 304 to a conduction-state. Furthermore, the method 700 comprises coupling 702 the source of the power transistor 304 directly to a low voltage potential (e.g. ground) within a second time interval 814, to put the power transistor 304 to the conduction-state.

The driver circuit 350 may further comprise a charge pump or DC-to-DC converter (not shown in any of the Figures) which is configured to converter the logic supply voltage (provided by the supply voltage capacitor 420) to the gate supply voltage (to be applied to the gate of the power switch 304). As such, the supply voltage capacitor 420 may be used to recharge the gate of the power switch 304. Furthermore, the power switch 304 may be used as a charge pump (with or without parallel capacitor or inductor based). This may be beneficial for multi-state power converter systems. In addition, such a charge pump may be used for power switches 304 which comprise a bipolar transistor with a relatively high base current.

Figure 9:
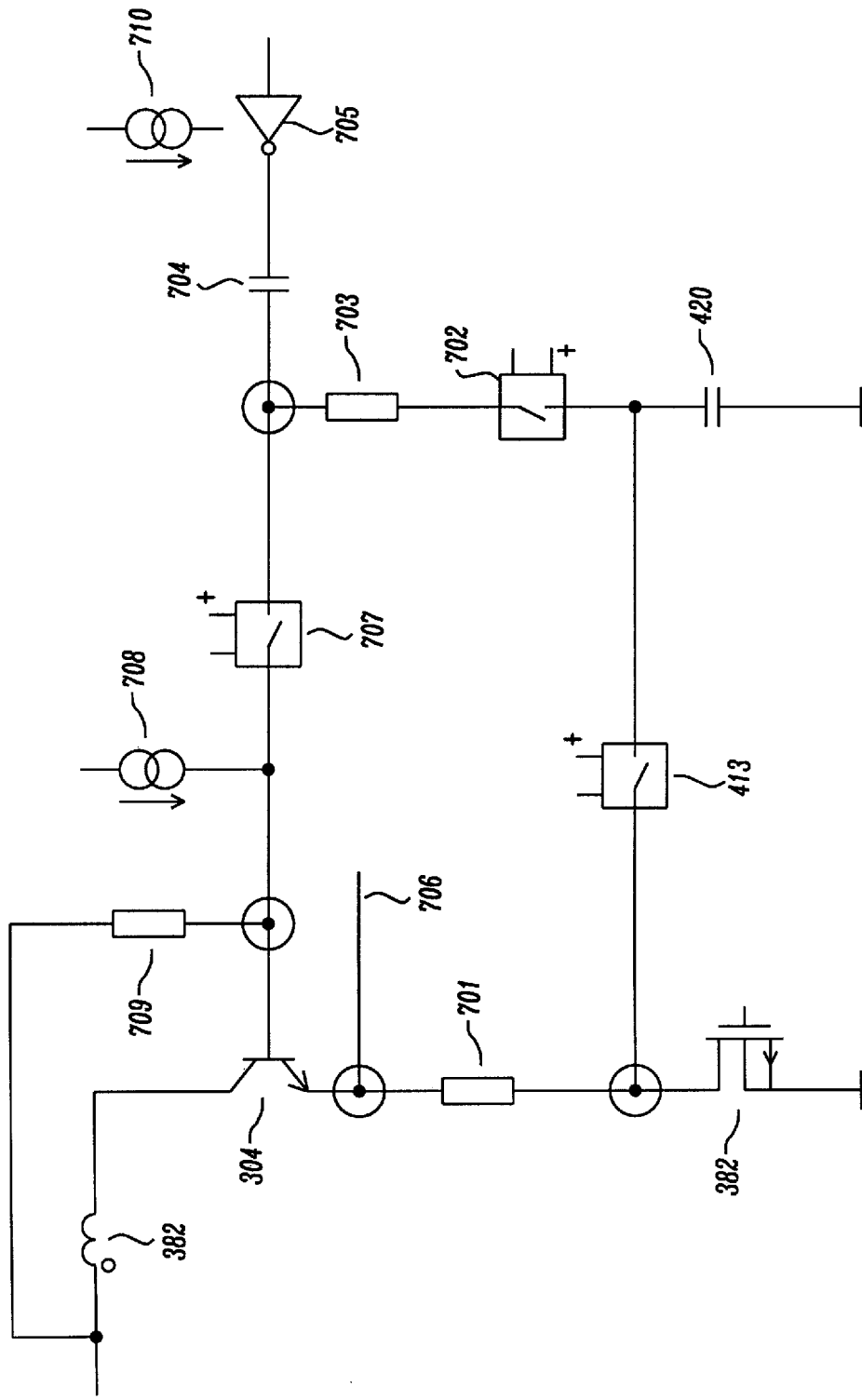
FIG. 9 shows a block diagram of excerpts of an example driver circuit comprising a bipolar transistor.

The use of a bipolar transistor is illustrated in FIG. 9. In the driver circuit of FIG. 9, the power switch 304 is implemented as a bipolar transistor comprising a collector which is coupled to the inductor 332, a base, and an emitter which is coupled to the control switch 382 (e.g. via a shunt resistor 701). The bipolar transistor 304 is controlled using the control switch 382 and the charging switch 413. As such, the bipolar transistor 304 is controlled via the emitter.

In a similar manner to the circuits shown in FIGS. 4, 5 and 6, the charging switch 413 may be used to (re)charge the supply voltage capacitor 420. The charging switch 413 may be part of the control unit 320. The pins of the control unit 320 are illustrated as dotted circles in FIG. 9. Furthermore, FIG. 9 comprises circuitry 704 (e.g. a capacitor or a charge pump) for shifting the level of the base of the bipolar transistor 304, when (re)charging the supply voltage capacitor 420. In particular, the level of the base may be shifted above the level of the logic supply voltage, in order to allow for a (re)charging of the supply voltage capacitor 420.

Upon start-up, the resistor 709 may be used to bring up the base of the bipolar transistor 304. Furthermore, the current source 708 may be configured to provide the base current (the switch 707 may be open). It should be noted that the current provided by the current sources described in the present document may be modified. Furthermore, it should be noted that an adjustable current source may be implemented as or may be replaced by one or more resistors. Alternatively or in addition, the current source may be operated in a pulse width modulation (PWM) mode for modifying the level of the current provided by the current source (in average).

As a result of providing a base current, the bipolar transistor 304 is put into on-state, when the control switch 382 and/or the charging switch 413 are closed. If the charging switch 413 is closed, the supply voltage capacitor 420 may be charged using the emitter current of the bipolar transistor 304 (the emitter current is typically 10 to 100 times higher than the base current).

Subsequent to opening the charging switch 413, the switch 702 may be closed in order to (re)charge the charge pump capacitor 704 (with the inverter 705 being at low level). The charge pump capacitor 704 may then be used to provide a level shift to the base of the bipolar transistor 304, in order to bring the level of the base of the bipolar transistor 304 above the level of the supply voltage capacitor 420 (when recharging the supply voltage capacitor 420).

For recharging the supply voltage capacitor 420, the charging switch 413 may be closed in order to close the bipolar transistor 304. During this period, the switch 702 is open and the switch 707 is closed. Furthermore, the inverter 705 is at high level. As a result of this, the charge pump capacitor 704 shifts the level of the base, thereby shifting the level of the emitter above the level of the logic supply voltage, thereby allowing for a recharging of the supply voltage capacitor 420. The base current is provided by the current source 710.

In addition, it should be noted that with a boost function, a voltage above the level of the logic supply voltage may generated continuously and may be used to supply the base of the bipolar transistor 304. The base supply may be toggling between two different voltages (a voltage which is pumped for charging the logic supply voltage and a normal lower voltage for normal operation).

Furthermore, FIG. 9 shows a measurement pin 706, e.g. for measuring the level of the emitter current.

As outlined in the present document, the current through the power switch 304 may be used to (re)charge the supply voltage capacitor 420. This may be done, e.g. when operating the power switch 304 in a switched mode, when operating the power switch 304 in a linear mode (e.g. as a bleeder) and/or upon start-up of the driver circuit 350. Furthermore, the power switch 304 may be operated during stand-by of the driver circuit 350 to (re)charge the supply voltage capacitor 420.

The charging of a power supply (e.g. of the supply voltage capacitor 420) outlined in the present document may also be applied to the charging of other elements or to the providing of a supply voltage to other components of the driver circuit (e.g. a microprocessor).

As outlined above, the power switch 304 may be operated in a linear mode to draw a bleeder current. The bleeder current may also be used to directly supply a drive current to an SSL device 104. In other words, the bleeder current may be controlled to correspond to a required drive current for the SSL device 104. The bleeder current may e.g. be used to provide a drive current for relatively low dimming levels or for a standby mode or for a blinking of the SSL device 104.

In the present document, circuitry has been described for providing a cost efficient driver circuit for an SSL device. The driver circuit makes use of a power converter network which is switched using a source controlled power switch. The power converter network comprises an inductor 322 (e.g. a transformer). The described circuitry does not make use of any auxiliary windings of such a transformer, which may otherwise be need for recharging the logic supply voltage, for detecting freewheeling and/or for performing measurements of the voltage at the inductor 322. Hence, a cost efficient driver circuit may be provided.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A driver circuit which is configured to generate a drive voltage to a load subject to an input voltage, wherein the driver circuit comprises a power converter network comprising an inductor which is coupled to the input voltage;
a power transistor having a high voltage terminal which is coupled to the inductor and having a low voltage terminal;
a controller; and
a supply voltage capacitor for providing a logic supply voltage to the controller; wherein
the controller comprises a control transistor which is configured to couple the low voltage terminal of the power transistor to a low voltage potential or to decouple the low voltage terminal from the low voltage potential, in order to put the power transistor to a conduction-state or an off-state, respectively;
the controller comprises a charging transistor forming a serial arrangement with the supply voltage capacitor; wherein the serial arrangement is arranged in parallel to the control transistor, and wherein the charging transistor is configured to couple or to decouple the low voltage terminal of the power transistor to or from the supply voltage capacitor, in order to put the power transistor to the conduction-state or off-state, respectively; and the controller is configured to put the power transistor to the conduction-state using the charging transistor within a first time interval and to put the power transistor to the conduction-state using the control transistor within a second time interval.

2. The driver circuit of claim 1, wherein the conduction-state corresponds to an on-state of the power transistor;

the controller is configured to operate the power transistor in a switched mode between the on-state and the off-state;

the first and second time intervals are different; and, the first time interval precedes the second time interval within a first phase of a commutation cycle, when the power transistor is in an on-state.

3. The driver circuit of claim 1, wherein the controller is configured to operate the charging transistor in a linear mode to control the level of a current through the power transistor; and, determine a length of the first time interval and/or an operation point of the charging transistor based on a charge to be provided to the supply voltage capacitor.

4. The driver circuit of claim 1, wherein the controller is configured to determine a level of the logic supply voltage provided by the supply voltage capacitor; and, control the charging transistor and the control transistor based on the determined level of the logic supply voltage.

5. The driver circuit of claim 1, wherein the controller is configured to control an on-resistance of the charging transistor and/or of the control transistor to operate the power transistor in a switched mode and/or in a linear mode.

6. The driver circuit of claim 1, wherein the controller further comprises a regulator arranged in parallel to the supply voltage capacitor and configured to limit a voltage drop across the supply voltage capacitor to a pre-determined overvoltage level.

7. The driver circuit of claim 1, wherein the controller further comprises a charging diode configured to block a current flowing from the supply voltage capacitor to the power transistor.

8. The driver circuit of claim 1, wherein the controller further comprises freewheeling detection circuitry configured to detect a transient of a voltage level at the low voltage terminal of the power transistor, when the freewheeling detection circuitry is coupled to the low voltage terminal of the power transistor and when the power transistor is in off-state.

9. The driver circuit of claim 1 further comprising a gate resistor arranged between the high voltage terminal of the power transistor and an intermediate voltage terminal of the power transistor; and stabilizing capacitor arranged between the intermediate voltage terminal of the power transistor and the low voltage potential; terminal of the power transistor.

10. The driver circuit of claim 9, further comprising a Zener function arranged between the intermediate voltage terminal of the power transistor and the supply voltage capacitor; wherein a breakthrough voltage of the Zener function depends on a target level of the gate supply voltage and a target level of the logic supply voltage.

11. The driver circuit of claim 9, further comprising a gate diode which is arranged in series with the gate resistor and which is configured to block a current flowing from the intermediate voltage terminal of the power transistor to the high voltage terminal of the power transistor.

12. The driver circuit of claim 11, further comprising a current mirror comprising an input side and an output side; wherein the input side is arranged between the gate resistor and the intermediate voltage terminal of the power transistor; and a shunt resistor function arranged in series with the output side of the current mirror, such that a voltage drop at the shunt resistor function provides an indication of a voltage level at the high voltage terminal of the power transistor.

13. The driver circuit of claim 1, wherein a. the power transistor comprises a bipolar transistor with a base; and the driver circuit further comprises a charge pump configured to increase a voltage level of the base of the bipolar transistor.

14. A method for charging a supply voltage capacitor configured to provide a logic supply voltage to a controller of a driver circuit; wherein the driver circuit is configured to provide a drive voltage to a load subject to an input voltage; wherein the driver circuit comprises a power converter network and a power transistor; wherein the method comprises coupling a low voltage terminal of the power transistor to the supply voltage capacitor within a first time interval using a charging transistor, in order to put the power transistor to a conduction-state; and, coupling the low voltage terminal of the power transistor directly to a low voltage potential within a second time interval using a control transistor, in order to put the power transistor to the conduction-state;

wherein the charging transistor and the control transistor are controlled by the controller;

wherein the control transistor is configured to couple the low voltage terminal of the power transistor to the low voltage potential or to decouple the low voltage terminal from the low voltage potential, in order to put the power transistor to a conduction-state or an off-state, respectively; and wherein the charging transistor forms a serial arrangement with the supply voltage capacitor; wherein the serial arrangement is arranged in parallel to the control transistor, and wherein the charging transistor is configured to couple or to decouple the low voltage terminal of the power transistor to or from the supply voltage capacitor, in order to put the power transistor to the conduction-state or off-state, respectively.

15. The method of claim 14 wherein the conduction-state corresponds to an on-state of the power transistor.

16. The method of claim 14 wherein the controller is configured to operate the power transistor in a switched mode between the on-state and the off-state.

17. The method of claim 14 wherein the first time interval and second time interval are different.

18. The method of claim 14, wherein the first time interval precedes the second time interval within a first phase of a commutation cycle, when the power transistor is in an on-state.

\* \* \* \* \*